US012531213B2

(12) United States Patent
Abe et al.

(10) Patent No.: US 12,531,213 B2
(45) Date of Patent: Jan. 20, 2026

(54) PLASMA PROCESSING APPARATUS

(71) Applicant: Tokyo Electron Limited, Tokyo (JP)

(72) Inventors: Ryoya Abe, Miyagi (JP); Tetsuji Sato, Miyagi (JP); Shin Matsuura, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 415 days.

(21) Appl. No.: 18/130,879

(22) Filed: Apr. 4, 2023

(65) Prior Publication Data

US 2023/0317425 A1 Oct. 5, 2023

(30) Foreign Application Priority Data

Apr. 4, 2022 (JP) ................................ 2022-062310

(51) Int. Cl.
*H01J 37/32* (2006.01)

(52) U.S. Cl.
CPC . *H01J 37/32633* (2013.01); *H01J 2237/0268* (2013.01); *H01J 2237/334* (2013.01)

(58) Field of Classification Search
CPC ........... H01J 37/32633; H01J 37/32834; H01J 37/32458; H01J 37/32495; H01J 2237/0268; H01J 2237/334
USPC ................ 156/345.29, 345.33; 118/733, 715
See application file for complete search history.

(56) References Cited

FOREIGN PATENT DOCUMENTS

| | | | |
|---|---|---|---|
| JP | 2012-513094 | A | 6/2012 |
| WO | 2010/080423 | A2 | 7/2010 |

*Primary Examiner* — Rodney G McDonald
(74) *Attorney, Agent, or Firm* — XSENSUS LLP

(57) ABSTRACT

A plasma processing apparatus comprising: a plasma processing chamber; a substrate support; and a baffle structure to surround the substrate support. The baffle structure includes an upper baffle plate having a plurality of first openings, each of the plurality of first openings having a first width, and a lower baffle plate having a plurality of second openings, each of the plurality of second openings having an upper opening portion and a lower opening portion. A liner structure surrounds a plasma processing space disposed above the substrate support, and includes an inner cylindrical liner and an outer cylindrical liner. The inner cylindrical liner has a plurality of third openings, each of the plurality of third openings having a fourth width. The outer cylindrical liner has a plurality of fourth openings, each of the plurality of fourth openings having an inner opening portion and an outer opening portion.

16 Claims, 10 Drawing Sheets

PLASMA PROCESSING APPARATUS

CROSS-REFERENCE TO RELATED APPLICATIONS

This application claims priority to Japanese Patent Application No. 2022-062310 filed on Apr. 4, 2022, the entire contents of which are incorporated herein by reference.

TECHNICAL FIELD

The present disclosure relates to a plasma processing apparatus.

BACKGROUND

A technique for at least partially adjusting a pressure while confining plasma in a plasma processing chamber during plasma processing of a substrate is disclosed in Patent Document 1.

PRIOR ART DOCUMENTS

Patent Documents

Patent Document 1: Japanese Laid-open Patent Publication No. 2012-513094

SUMMARY

The present disclosure provides a technique for suppressing deterioration of an exhaust function in a plasma processing apparatus.

In accordance with an aspect of the present disclosure, there is a plasma processing apparatus comprising: a plasma processing chamber; a substrate support disposed in the plasma processing chamber; a baffle structure disposed in the plasma processing chamber to surround the substrate support, the baffle structure including an upper baffle plate and a lower baffle plate, the upper baffle plate having a plurality of first openings, each of the plurality of first openings having a first width, the lower baffle plate having conductivity and coupled to a ground potential, the lower baffle plate having a plurality of second openings, each of the plurality of second openings having an upper opening portion and a lower opening portion, the upper opening portion having a second width greater than the first width, the lower opening portion having a third width smaller than the first width; and a liner structure disposed in the plasma processing chamber to surround a plasma processing space disposed above the substrate support, the liner structure including an inner cylindrical liner and an outer cylindrical liner, the inner cylindrical liner having a plurality of third openings, each of the plurality of third openings having a fourth width, the outer cylindrical liner having conductivity and coupled to a ground potential, the outer cylindrical liner having a plurality of fourth openings, each of the plurality of fourth openings having an inner opening portion and an outer opening portion, the inner opening portion having a fifth width greater than the fourth width, the outer opening portion having a sixth width smaller than the fourth width.

BRIEF DESCRIPTION OF THE DRAWINGS

The objects and features of the present disclosure will become apparent from the following description of embodiments, given in conjunction with the accompanying drawings, in which.

DETAILED DESCRIPTION

Figure 1:
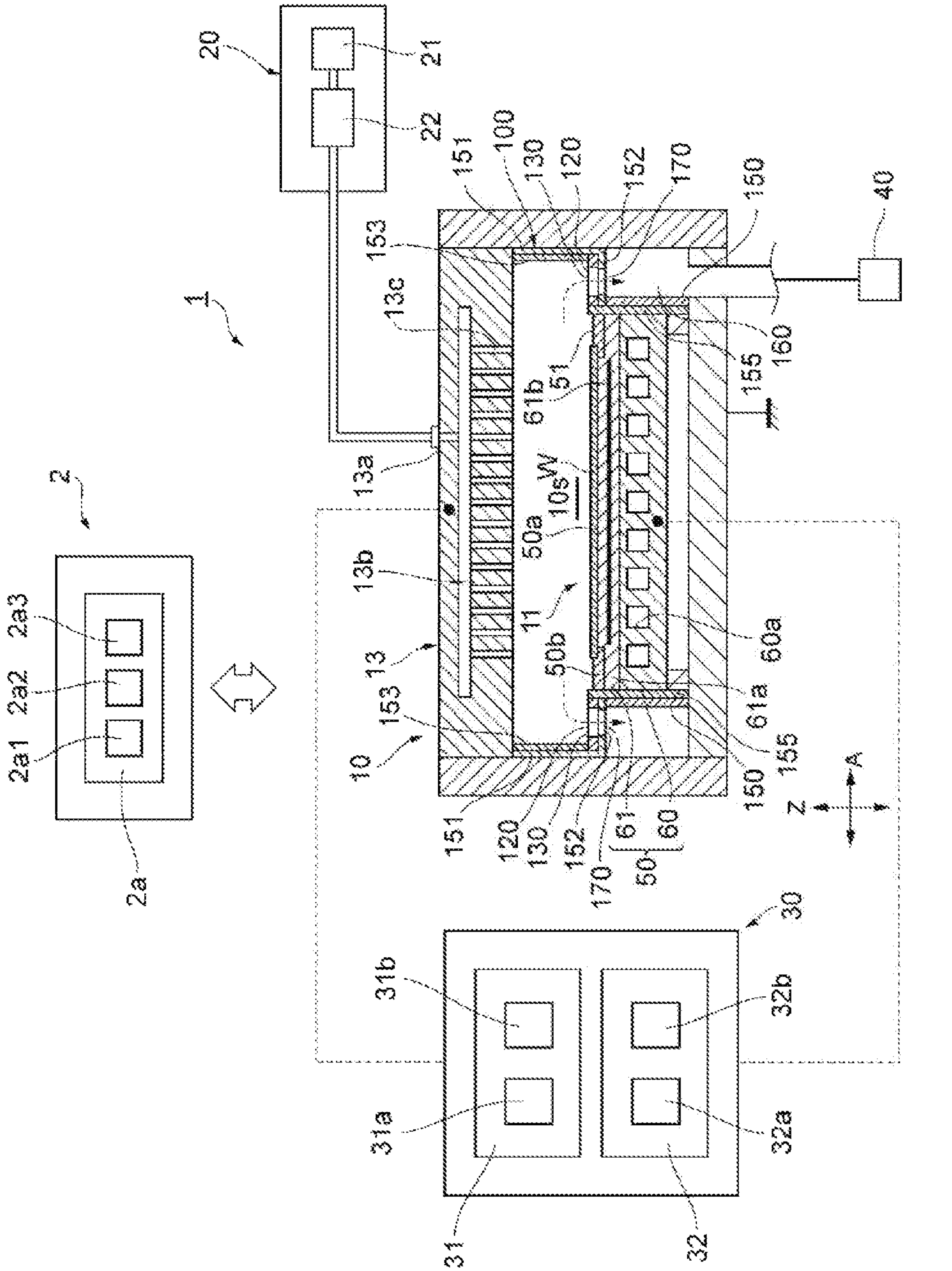
FIG. 1 shows an outline of a configuration example of a plasma processing apparatus according to an embodiment 1.

Hereinafter, embodiments of the present disclosure will be described.

In an exemplary embodiment, there is a plasma processing apparatus comprising: a plasma processing chamber; a substrate support disposed in the plasma processing chamber; a baffle structure disposed in the plasma processing chamber to surround the substrate support, the baffle structure including an upper baffle plate and a lower baffle plate, the upper baffle plate having a plurality of first openings, each having a first width, the lower baffle plate having conductivity and coupled to a ground potential, the lower baffle plate having a plurality of second openings, each having an upper opening portion and a lower opening portion, the upper opening portion having a second width greater than the first width, the lower opening portion having a third width smaller than the first width; and a liner structure disposed in the plasma processing chamber to surround a plasma processing space disposed above the substrate support, the liner structure including an inner cylindrical liner and an outer cylindrical liner, the inner cylindrical liner having a plurality of third openings, each having a fourth width, the outer cylindrical liner having conductivity and coupled to a ground potential, the outer cylindrical liner having a plurality of fourth openings, each having an inner opening portion and an outer opening portion, the inner opening portion having a fifth width greater than the fourth width, the outer opening portion having a sixth width smaller than the fourth width.

In an exemplary embodiment, the first opening has the first width from an inlet to an outlet of the first opening.

In an exemplary embodiment, the third opening has the fourth width from an inlet to an outlet of the third opening.

In an exemplary embodiment, the upper opening portion of the second opening has the second width from an inlet to an outlet of the upper opening portion.

In an exemplary embodiment, the upper opening portion of the second opening has the second width at an inlet of the upper opening portion and the third width at an outlet of the upper opening portion, and has a shape with a width that is reduced from the inlet to the outlet of the upper opening portion.

In an exemplary embodiment, the inner opening portion of the fourth opening has the fifth width from an inlet to an outlet of the inner opening portion.

In an exemplary embodiment, the inner opening portion of the fourth opening has the fifth width at an inlet of the inner opening portion and the sixth width at an outlet of the inner opening portion, and has a shape with a width that is reduced from the inlet to the outlet of the inner opening portion.

In an exemplary embodiment, the inner cylindrical liner and the upper baffle plate contain a conductive material or an insulating material.

In an exemplary embodiment, the inner cylindrical liner and the upper baffle plate contain a material formed from quartz, Si or SiC.

In an exemplary embodiment, the outer cylindrical liner and the lower baffle plate contain a conductive material.

In an exemplary embodiment, the outer cylindrical liner and the lower baffle plate includes a conductive material and a plasma resistant coating on the conductive material.

In an exemplary embodiment, the conductive material of the outer cylindrical liner and the lower baffle plate is formed from aluminum.

In an exemplary embodiment, a ratio of the first width to the second width is within a range of 1:10 to 9:10, and a ratio of the third width to the first width is within a range of 1:10 to 9:10.

In an exemplary embodiment, a ratio of the fourth width to the fifth width is within a range of 1:10 to 9:10, and a ratio of the sixth width to the fourth width is within a range of 1:10 to 9:10.

In an exemplary embodiment, there is a plasma processing apparatus comprising: a plasma processing chamber; a substrate support disposed in the plasma processing chamber; a liner structure disposed in the plasma processing chamber to surround a plasma processing space disposed above the substrate support, the liner structure including an inner liner and an outer liner, the inner liner having a plurality of first openings, each having a first width, the outer liner having conductivity and coupled to a ground potential, the outer liner having a plurality of second openings, each having an inner opening portion and an outer opening portion, the inner opening portion having a second width greater than the first width, the outer opening portion having a third width smaller than the first width.

In an exemplary embodiment, there is a plasma processing apparatus comprising: a plasma processing chamber; a substrate support disposed in the plasma processing chamber; and a baffle structure disposed in the plasma processing chamber to surround the substrate support, the baffle structure including an upper baffle and a lower baffle, the upper baffle having a plurality of first openings, each having a first width, the lower baffle having conductivity and coupled to a ground potential, the lower baffle having a plurality of second openings, each having an upper opening portion and a lower opening portion, the upper opening portion having a second width greater than the first width, the lower opening portion having a third width smaller than the first width.

Hereinafter, embodiments of the present disclosure will be described in detail with reference to the accompanying drawings. Like reference numerals will be given to like or corresponding parts throughout the drawings, and redundant description thereof will be omitted. Unless otherwise specified, positional relationships such as up, down, left, and right are based on the positional relationships shown in the drawings. The dimensional ratios in the drawings do not indicate the actual ratios, and the actual ratios are not limited to the illustrated ratios.

Embodiment 1 of Plasma Processing Apparatus 1

Hereinafter, a configuration example of a plasma processing system will be described. FIG. 1 shows a configuration example of a capacitively coupled plasma processing apparatus. A plasma processing apparatus 1 as a substrate processing apparatus according to one embodiment performs a plasma processing method for performing plasma processing on a substrate.

The plasma processing system includes a capacitively coupled plasma processing apparatus 1 and a controller 2. The capacitively coupled plasma processing apparatus 1 includes a plasma processing chamber (also simply referred to as "chamber") 10, a gas supply 20, a power supply 30, and an exhaust system 40. The plasma processing apparatus 1 further includes a substrate support 11 and a gas introducing unit. The gas introducing unit is configured to introduce at least one processing gas into the plasma processing chamber 10. The gas introducing unit includes a showerhead 13. The substrate support 11 is disposed in the plasma processing chamber 10. The showerhead 13 is disposed above the substrate support 11. In one embodiment, the showerhead 13 forms at least a part of the ceiling of plasma processing chamber 10. The plasma processing chamber 10 has a plasma processing space (substrate processing space) **10*s* defined by the showerhead 13, a sidewall 10*a* of the plasma processing chamber 10, and the substrate support 11. The plasma processing chamber 10 has at least one gas inlet for supplying at least one processing gas to the plasma processing space 10*s* and at least one gas outlet for exhausting a gas from the plasma processing space. The plasma processing chamber 10 is grounded. The showerhead 13 and the substrate support 11 are electrically isolated from the plasma processing chamber 10**.

The substrate support 11 includes a main body 50 and a ring assembly 51. The main body 50 has a central region **50*a* for supporting a substrate W and an annular region 50*b* for supporting the ring assembly 51. A wafer is an example of the substrate W. The annular region 50*b* of the main body 50 surrounds the central region 50*a* of the main body 50 in plan view. The substrate W is disposed on the central region 50*a* of the main body 50, and the ring assembly 51 is disposed on the annular region 50*b* of the main body 50 to surround the substrate W on the central region 50*a* of the main body 50. Therefore, the central region 50*a* is also referred to as a substrate supporting surface for supporting the substrate W, and the annular region 50*b* is also referred to as a ring supporting surface for supporting the ring assembly 51**.

In one embodiment, the main body 50 includes a base 60 and an electrostatic chuck 61. The base 60 includes a conductive member. The conductive member of the base 60 can function as a lower electrode. The electrostatic chuck 61 is disposed on the base 60. The electrostatic chuck 61 includes a ceramic member 61*a* and an electrostatic electrode 61*b* disposed in the ceramic member 61*a*. The ceramic member 61*a* has the central region 50*a*. In one embodiment, the ceramic member 61*a* also has the annular region 50*b*. Another member surrounding the electrostatic chuck 61, such as an annular electrostatic chuck or an annular insulating member, may have the annular region 50*b*. In this case, the ring assembly 51 may be disposed on the annular electrostatic chuck or the annular insulating member, or may be disposed on both the electrostatic chuck 61 and the annular insulating member. In addition, an RF or DC electrode may be disposed in the ceramic member 61*a*. In this case, the RF or DC electrode functions as a lower electrode. The RF or DC electrode is also referred to as a bias electrode when a bias RF signal or a DC signal, which will be described later, is connected to the RF or DC electrode. Both the conductive member of the base 60 and the RF or DC electrode may function as two lower electrodes.

The ring assembly 51 includes one or more annular members. In one embodiment, one or more annular members include one or more edge rings and at least one cover ring. The edge ring is made of a conductive material or an insulating material, and the cover ring is made of an insulating material.

Further, the substrate support 11 may include a temperature control module configured to control at least one of the electrostatic chuck 61, the ring assembly 51, and the substrate to a target temperature. The temperature control module may include a heater, a heat transfer medium, a channel 60*a*, or a combination thereof. A heat transfer fluid, such as brine or a gas, flows through the channel 60*a*. In one embodiment, the channel 60*a* is formed in the base 60, and one or more heaters are disposed in the ceramic member 61*a* of the electrostatic chuck 61. Further, the substrate support 11 may include a heat transfer gas supply configured to supply a heat transfer gas to the gap between the backside of the substrate W and the central region 50*a*.

The substrate support 11 is provided with lifters (lift pins) (not shown). In one embodiment, the lifters are disposed in a plurality of through-holes vertically penetrating through the substrate support 11, and are moved vertically in the through-holes by a driving device (not shown). In one embodiment, the substrate W is loaded into and unloaded from the chamber 10 by a transfer arm (not shown). The lifters can support and vertically move the substrate W on the substrate support 11, exchange the substrate W with the transfer arm, and place the substrate W on the substrate support 11.

The showerhead 13 is configured to introduce at least one processing gas from the gas supply 20 into the plasma processing space 10*s*. The showerhead 13 has at least one gas inlet 13*a*, at least one gas diffusion space 13*b*, and a plurality of gas feeding ports 13*c*. The processing gas supplied to the gas inlet 13*a* passes through the gas diffusion space 13*b* and is introduced into the plasma processing space 10*s* through the gas feeding ports 13*c*. Further, the showerhead 13 includes an upper electrode. The gas introducing unit may include, in addition to the showerhead 13, one or more side gas injectors (SGI) attached to one or more openings formed in the sidewall 10*a*.

The gas supply 20 may include at least one gas source 21 and at least one flow controller 22. In one embodiment, the gas supply 20 is configured to supply at least one processing gas from the corresponding gas source 21 through the corresponding flow controller 22 to the showerhead 13. The flow controllers 22 may include, e.g., a mass flow controller or a pressure-controlled flow controller. In addition, the gas supply 20 may include one or more flow modulation devices for modulating the flow of at least one processing gas or causing it to pulsate.

The power supply 30 includes an RF power supply 31 coupled to the plasma processing chamber 10 through at least one impedance matching circuit. The RF power supply 31 is configured to supply at least one RF signal (RF power), such as a source RF signal and a bias RF signal, to at least one lower electrode and/or at least one upper electrode. Accordingly, plasma is generated from at least one processing gas supplied to the plasma processing space 10*s*. Therefore, the RF power supply 31 may function as at least a part of a plasma generator configured to generate a plasma from one or more processing gases in the plasma processing chamber 10. Further, by supplying the bias RF signal to at least one lower electrode, a bias potential is generated at the substrate W, and ions in the produced plasma can be attracted to the substrate W.

In one embodiment, the RF power supply 31 includes a first RF generator 31*a* and a second RF generator 31*b*. The first RF generator 31*a* is coupled to at least one lower electrode and/or at least one upper electrode through at least one impedance matching circuit, and is configured to generate a source RF signal (source RF power) for plasma generation. In one embodiment, the source RF signal has a frequency within a range of 10 MHz to 150 MHz. In one embodiment, the first RF generator 31*a* may be configured to generate a plurality of source RF signals having different frequencies. The generated one or more source RF signals are supplied to at least one lower electrode and/or at least one upper electrode.

The second RF generator 31*b* is coupled to the at least one lower electrode through at least one impedance matching circuit, and is configured to generate a bias RF signal (bias RF power). The frequency of the bias RF signal may be the same as or different from the frequency of the source RF signal. In one embodiment, the bias RF signal has a frequency lower than the frequency of the source RF signal. In one embodiment, the bias RF signal has a frequency within a range of 100 kHz to 60 MHz. In one embodiment, the second RF generator 31*b* may be configured to generate a plurality of bias RF signals having different frequencies. The generated one or more bias RF signals are supplied to at least one lower electrode. In various embodiments, at least one of the source RF signal and the bias RF signal may pulsate.

The power supply 30 may include a DC power supply 32 coupled to the plasma processing chamber 10. The DC power supply 32 includes a first DC generator 32*a* and a second DC generator 32*b*. In one embodiment, the first DC generator 32*a* is connected to the at least one lower electrode, and is configured to generate a first DC signal. The generated first DC signal is applied to at least one lower electrode. In one embodiment, the second DC generator 32*b* is connected to at least one upper electrode, and is configured to generate a second DC signal. The generated second DC signal is applied to at least one upper electrode.

In various embodiments, at least one of the first DC signal and the second DC signal may pulsate. In this case, a sequence of DC voltage pulses is applied to at least one lower electrode and/or at least one upper electrode. The waveform of the voltage pulses may have a rectangular shape, a trapezoidal shape, a triangular shape, or a combination thereof. In one embodiment, a waveform generator for generating a sequence of voltage pulses from a DC signal is connected between the first DC generator 32*a* and at least one lower electrode. Therefore, the first DC generator 32*a* and the waveform generator constitute a voltage pulse generator. When the second DC generator 32*b* and the waveform generator constitute a voltage pulse generator, the voltage pulse generator is connected to at least one upper electrode. The voltage pulse may have positive polarity or negative polarity. Further, the sequence of voltage pulses may include one or more positive voltage pulses and one or more negative voltage pulses in one cycle. The first and second DC generators 32*a* and 32*b* may be provided in addition to the RF power supply 31, and the first DC generator 32*a* may be provided instead of the second RF generator 31*b*.

The exhaust system 40 may be connected to a gas outlet 10*e* disposed at the bottom portion of the plasma processing chamber 10, for example. The exhaust system 40 may include a pressure control valve and a vacuum pump. The pressure control valve adjusts a pressure in the plasma processing space 10*s*. The vacuum pump may include a turbo molecular pump, a dry pump, or a combination thereof.

The controller 2 processes computer-executable instructions that cause the plasma processing apparatus 1 to perform various steps described in the present disclosure. The controller 2 may be configured to control individual components of the plasma processing apparatus 1 to perform various steps described herein. In one embodiment, the controller 2 may be partially or entirely included in the plasma processing apparatus 1. The controller 2 may include, e.g., a computer 2*a*. The computer 2*a* may include, e.g., a central processing unit (CPU) 2*a*1, a storage device 2*a*2, and a communication interface 2*a*3. The central processing unit 2*a*1 may be configured to read out a program from the storage device 2*a*2 and perform various operations by executing the read-out program. The program may be stored in advance in the storage device 2*a*2, or may be acquired via a medium when necessary. The acquired program is stored in the storage device 2*a*3, read-out from the storage device 2*a*2, and executed by the central processing unit 2*a*1. The medium may be various media that is readable by the computer 2*a*, or may be a communication line connected to the communication interface 2*a*3. The storage device 2*a*2 may include a random access memory (RAM), a read only memory (ROM), a hard disk drive (HDD), a solid state drive (SSD), or a combination thereof. The communication interface 2*a*3 may communicate with the plasma processing apparatus 1 via a communication line such as a local area network (LAN) or the like.

The plasma processing apparatus 1 of the present embodiment includes a plasma confinement structure 100 that defines the plasma processing space 10*s*. The plasma confinement structure 100 includes a baffle structure and a liner structure. The baffle structure is configured to exhaust an atmosphere (gas) in the plasma processing space 10*s*. In one embodiment, the baffle structure is disposed in the chamber 10 to surround the substrate support 11. The baffle structure includes an upper baffle plate 120 facing the plasma processing space 10*s* and a lower baffle plate 152 disposed below the upper baffle plate 120. The upper baffle plate 120 and the lower baffle plate 152 extend horizontally. The upper surface of the lower baffle plate 152 is in contact with the bottom surface of the upper baffle plate 120.

The liner structure includes an inner cylindrical liner 153 and an outer cylindrical liner 151. In one embodiment, the inner cylindrical liner 153 has a cylindrical shape. The inner cylindrical liner 153 is disposed concentrically with the substrate support 11 and the upper baffle plate 120. The inner cylindrical liner 153 is disposed on the outer end of the upper baffle plate 120. The inner cylindrical liner 153 is disposed at a lateral side of the plasma processing space 10*s* in a horizontal direction, and is exposed to the plasma processing space 10*s*. In one embodiment, the inner cylindrical liner 153 contains an insulating material and has an insulating property. In one embodiment, the inner cylindrical liner 153 contains a material such as quartz, Si or SiC. Further, the inner cylindrical liner 153 may contain a conductive material and have conductivity.

Figure 2:
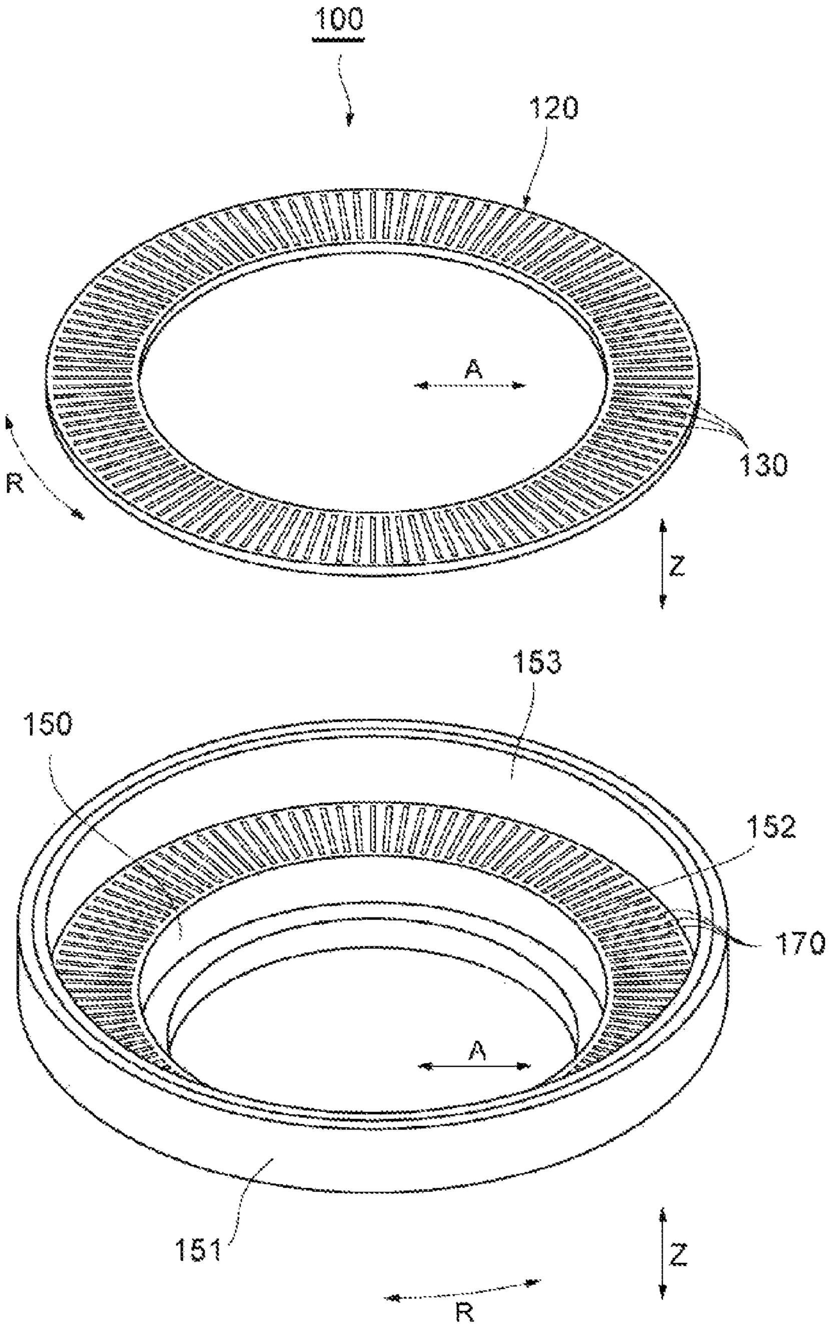
FIG. 2 is a perspective view showing an example of a plasma confinement structure.

The outer cylindrical liner 151 has a cylindrical shape. The outer cylindrical liner 151 is disposed concentrically with the substrate support 11 and the lower baffle plate 152. The outer cylindrical liner 151 is disposed on the outer end of the lower baffle plate 152. The outer cylindrical liner 151 overlaps with the outer side of the inner cylindrical liner 153 in a radial direction A. The outer cylindrical liner 151 contains a conductive material such as aluminum (Al) or the like, and has conductivity. In one embodiment, the outer cylindrical liner 151 has a plasma-resistant coating on a part or an entire surface thereof. In the example of FIG. 2, the inner cylindrical liner 153 is a separate member from the upper baffle plate 120. In this case, the inner cylindrical liner 153 may be in contact with the upper baffle plate 120 or may be separated from the upper baffle plate 120. The inner cylindrical liner 153 may be integrated with the upper baffle plate 120. Although the outer cylindrical liner 151 is integrated with the lower baffle plate 152 in the example of FIG. 2, the outer cylindrical liner 151 may be a separate member from the lower baffle plate 152. In this case, the outer cylindrical liner 151 may be in contact with the lower baffle plate 152, or may be separated from the lower baffle plate 152. FIG. 2 is a perspective view showing an example of the plasma confinement structure 100 in one embodiment.

In one embodiment, the upper baffle plate 120 has an annular thin plate shape. The upper baffle plate 120 overlaps with the lower baffle plate 152 to be described later at a position above the lower baffle plate 152 with the plate surface thereof directed upward. The upper baffle plate 120 is disposed at the outer periphery of the substrate support 11 and positioned below the plasma processing space 10*s*. The upper baffle plate 120 is exposed to the plasma processing space 10*s*. In one embodiment, the upper baffle plate 120 contains an insulating material and has an insulating property. In one embodiment, the upper baffle plate 120 contains a material such as quartz, Si, or SiC. The upper baffle plate 120 may contain a conductive material and have conductivity.

The upper baffle plate 120 has a plurality of first openings 130. In one embodiment, each of the first openings 130, which is an elongated hole extending in the radial direction (direction from the center toward the outer periphery) A of the substrate support 11, penetrates through the upper baffle plate 120 from the upper surface to the bottom surface thereof in a vertical direction Z. The first openings 130 are arranged at regular intervals along a circumferential direction R of the outer circumference of the substrate support 11. In one embodiment, the first openings 130 may be arranged at intervals of 1° to 5° in the circumferential direction R.

The lower baffle plate 152 contains a conductive material such as aluminum (Al) or the like, and has conductivity. The lower baffle plate 152 has a plasma resistant coating on a part or an entire surface thereof. The lower baffle plate 152 is electrically insulated from the substrate support 11. As shown in FIG. 1, in one embodiment, the lower baffle plate 152 is insulated from the substrate support 11 by one or more annular insulating members 155. The lower baffle plate 152 is connected to a ground potential. In one embodiment, the lower baffle plate 152 is connected to the ground potential through the chamber 10. In one embodiment, the lower baffle plate 152 is connected to the ground potential through the showerhead 13. The lower baffle plate 152 is electrically insulated from the upper electrode.

In one embodiment, the plasma confinement structure 100 further includes an inner cylindrical portion 150. The inner cylindrical portion 150 contains a conductive material such as aluminum (Al) or the like, and has conductivity. The inner cylindrical portion 150 is electrically connected to the lower baffle plate 152 and is electrically insulated from the substrate support 11. In one embodiment, the inner cylindrical portion 150 is insulated from the substrate support 11 by one or more annular insulating members 155. In one embodiment, the lower baffle plate 152 is connected to the ground potential through the inner cylindrical portion 150.

In one embodiment, the inner cylindrical portion 150 has a cylindrical shape, and is disposed at the outer periphery of the substrate support 11.

A vertically extending exhaust passage 160 is formed between the sidewall of the chamber 10 and the inner cylindrical portion 150. The exhaust passage 160 leads to/communicates with the gas outlet 10*e* disposed at the bottom portion of the chamber 10.

As shown in FIG. 2, in one embodiment, the lower baffle plate 152 has an annular thin plate shape. The upper baffle plate 120 may overlap with the lower baffle plate 152 at a position above the lower baffle plate 152. The lower baffle plate 152 is disposed at the outer periphery of the substrate support 11 and positioned below the plasma processing space 10*s*.

The lower baffle plate 152 has a plurality of second openings 170. Each of the second openings 170 is an elongated hole extending in the radial direction A of the substrate support 11, and penetrates through the lower baffle plate 152 from the upper surface to the bottom surface thereof in the vertical direction Z. The second openings 170 whose number is the same as the number of the first openings 130 are arranged at regular intervals that are the same intervals as those of the first openings 130 along the circumferential direction R of the outer circumference of the substrate support 11 arranged at the same intervals as those of the first openings 130. In one embodiment, the second openings 170 are arranged at the intervals of 1° to 5° in the circumferential direction. The second openings 170 communicate with the first openings 130, respectively.

Figure 3:
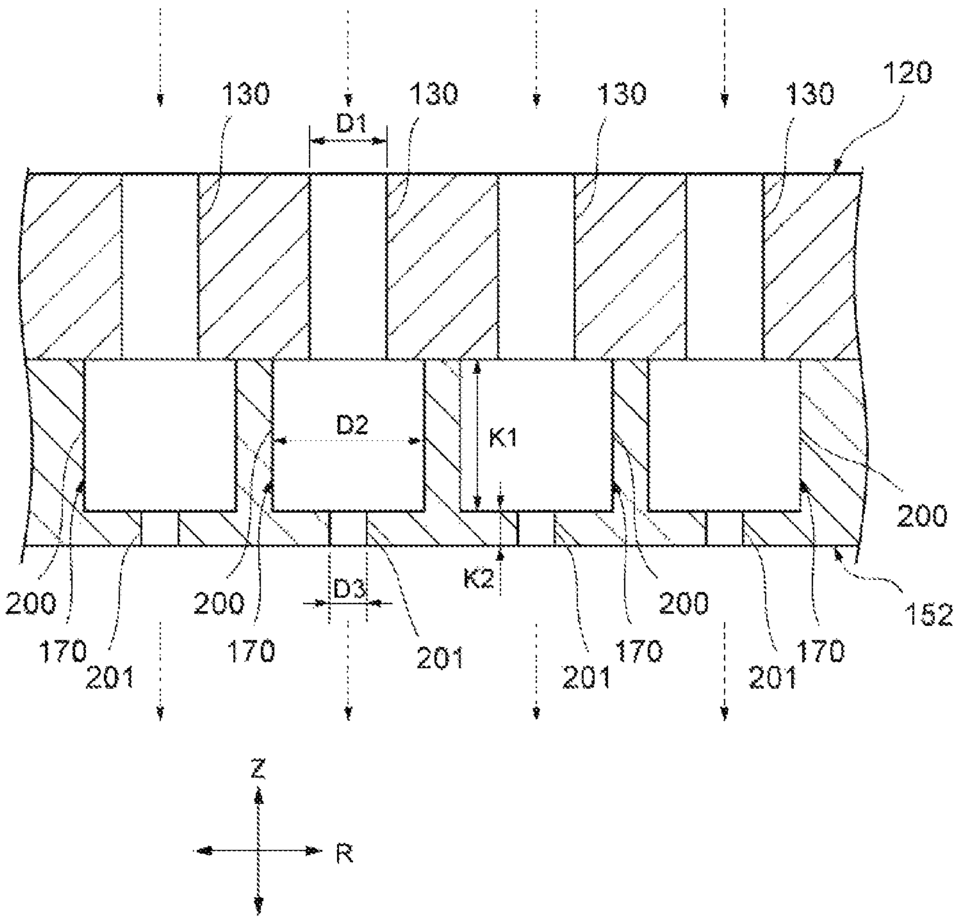
FIG. 3 is a vertical cross-sectional view showing examples of widths of a first opening and a second opening in the case where an upper baffle plate and a lower baffle plate are taken along a circumferential direction.

FIG. 3 is a vertical cross-sectional view showing an example of widths of the first openings 130 and the second openings 170 in the case where the upper baffle plate 120 and the lower baffle plate 152 are taken along the circumferential direction R in one embodiment. In one embodiment, the first opening 130 has a first width D1 that is constant from the inlet to the outlet of the first opening 140 in the circumferential direction (the short side direction of the first opening 130) R of the first opening 130.

In one embodiment, the second opening 170 has an upper opening portion 200 disposed at the upstream side of the second opening 170 and a lower opening portion 201 disposed at the downstream side of the second opening 170. The upper opening portion 200 has a second width D2 that is constant from the inlet to the outlet of the upper opening portion 200 in the circumferential direction R of the second opening 170 (the short side direction of the second opening 170). The second width D2 is greater than the first width D1.

The lower opening portion 201 has a third width D3 that is constant from the inlet to the outlet of the lower opening portion 201 in the circumferential direction R of the second opening 170. The third width D3 is smaller than the first width D1 and the second width D2.

In one embodiment, the ratio of the first width D1 to the second width D2 is within a range of 1:10 to 9:10.

In one embodiment, the ratio of the third width D3 to the first width D1 is within a range of 1:10 to 9:10.

A length K2 of the lower opening portion 201 is smaller than or equal to a length K1 of the upper opening portion 200. In one embodiment, the ratio of the length K1 of the upper opening portion 200 to the length K2 of the lower opening portion 201 is within a range of 1:1 to 10:1.

Figure 4:
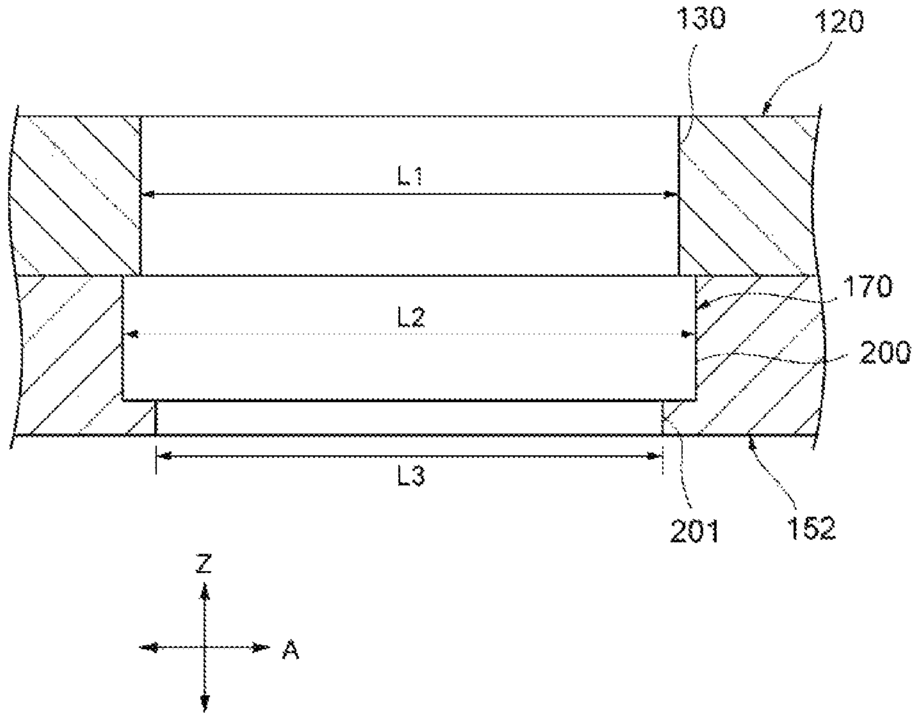
FIG. 4 is a vertical cross-sectional view showing examples of lengths of the first opening and the second opening in the case where the upper baffle plate and the lower baffle plate are taken along a radial direction.

FIG. 4 is a vertical cross-sectional view showing examples of the lengths of the first opening 130 and the second opening 170 in the case where the upper baffle plate 120 and the lower baffle plate 152 are taken along the radial direction A in one embodiment. In one embodiment, the first opening 130 has a first length L1 that is constant from the inlet to the outlet the first opening 130 in the radial direction (the long side direction of the first opening 130) A of the first opening 130.

In one embodiment, the upper opening portion 200 of the second opening 170 has a second length L2 that is constant from the inlet to the outlet of the second opening 170 in the radial direction (the long side direction of the second opening 170) A of the second opening 170. In one embodiment, the second length L2 is greater than the first length L1. In one embodiment, the lower opening portion 201 of the second opening 170 has a third length L3 that is constant from the inlet to the outlet of the second opening 170 in the radial direction A of the second opening 170. In one embodiment, the third length L3 is smaller than the first length L1 and the second length L2.

<Example of Plasma Processing Method>

The plasma processing method includes an etching process for etching a film on the substrate W using plasma.

First, the substrate W is loaded into the chamber 10 by the transfer arm, placed on the substrate support 11 by the lifters, and attracted and held on the substrate support 11 as shown in FIG. 1.

Next, the processing gas is supplied to the showerhead 13 by the gas supply 20, and then supplied from the showerhead 13 to the plasma processing space 10*s*. The processing gas supplied at this time contains a gas that generates active species required for etching the substrate W.

One or more RF signals are supplied from the RF power supply 31 to the upper electrode and/or the lower electrode. The atmosphere in the plasma processing space 10*s* may be exhausted from the gas outlet 10*e*, and a pressure in the plasma processing space 10*s* may be reduced. Accordingly, plasma is produced in the plasma processing space 10*s*, and the substrate W is etched.

The atmosphere in the plasma processing space 10*s* is exhausted by the exhaust system 40 during the etching process. The atmosphere in the plasma processing space 10*s* flows into the first openings 130 disposed at the outer periphery of the substrate support 11, passes through the second openings 170, and is exhausted from the gas outlet 10*e* through the exhaust passage 160.

In accordance with the present embodiment, the plasma processing apparatus 1 includes the baffle structure disposed to surround the substrate support 11 in the chamber 10. The baffle structure includes the upper baffle plate 120 and the lower baffle plate 152. The upper baffle plate 120 has the plurality of first openings 130. Each of the first openings 130 has the first width D1. The lower baffle plate 152 has conductivity, and is connected to the ground potential.

Further, the lower baffle plate 152 has the plurality of second openings 170 communicating with the plurality of first openings 130, respectively. Each of the second openings 170 has the upper opening portion 200 and the lower opening portion 201. The upper opening portion 200 has the second width D2 greater than the first width D1. The lower opening portion 201 has the third width D3 smaller than the first width D1. In a conventional plasma processing apparatus, the exhaust part such as the baffle plate is eroded by plasma during plasma processing, or deposits are generated at the exhaust part, which causes changes in the exhaust function of the plasma processing apparatus. If the exhaust function of the plasma processing apparatus changes, the plasma processing of the substrate is affected. In accordance with the present embodiment, as shown in FIG. 3, the second opening 170 has the upper opening portion 200 having the second width D2 greater than the first width D1 and the lower opening portion 201 having the third width D3 smaller than the first width D1, so that it is possible to control a rate of the exhaust of the plasma processing space 10*s* while ensuring the exhaust of the atmosphere in the plasma processing space 10*s*. Accordingly, temporal changes in the exhaust function of the plasma processing apparatus 1 can be suppressed. In addition, the lower baffle plate 152 having conductivity is connected to the ground potential, so that it is possible to form an RF return circuit in which the RF power supplied to the substrate support 11 flows to the ground through the lower baffle plate 152.

In the present embodiment, the first opening 130 has the first width D1 from the inlet to the outlet of the first opening 130, so that the atmosphere in the plasma processing space 10*s* can be properly exhausted.

In the present embodiment, the upper opening portion 200 of the second opening 170 has the second width D2 from the inlet to the outlet of the upper opening portion 200. Accordingly, a sufficient space is secured at the upper opening portion 200, and the flow path narrower than the second width D2 is formed at the lower opening portion 201, which makes it possible to control the exhaust of the atmosphere in the plasma processing space 10*s*.

In the present embodiment, the upper baffle plate 120 contains a material such as quartz, Si, or SiC. Accordingly, the plasma resistance of the upper baffle plate 120 can be improved, and the generation of particles in the chamber 10 can be suppressed.

In the present embodiment, the lower baffle plate 152 contains a conductive material. Accordingly, the RF return circuit can be secured more reliably.

In the present embodiment, the lower baffle plate 152 is made of a conductive material and a plasma resistant coating that covers the surface of the conductive material. Accordingly, the plasma resistance of the lower baffle plate 152 can be improved, and the exhaust of the plasma processing space 10*s* can be controlled while ensuring the exhaust of the atmosphere in the plasma processing space 10*s* for a long period of time.

In the present embodiment, the lower baffle plate 152 is made of a conductive material such as aluminum (Al), so that the RF return circuit can be preferably secured.

Embodiment 2 of Plasma Processing Apparatus 1

Figure 5:
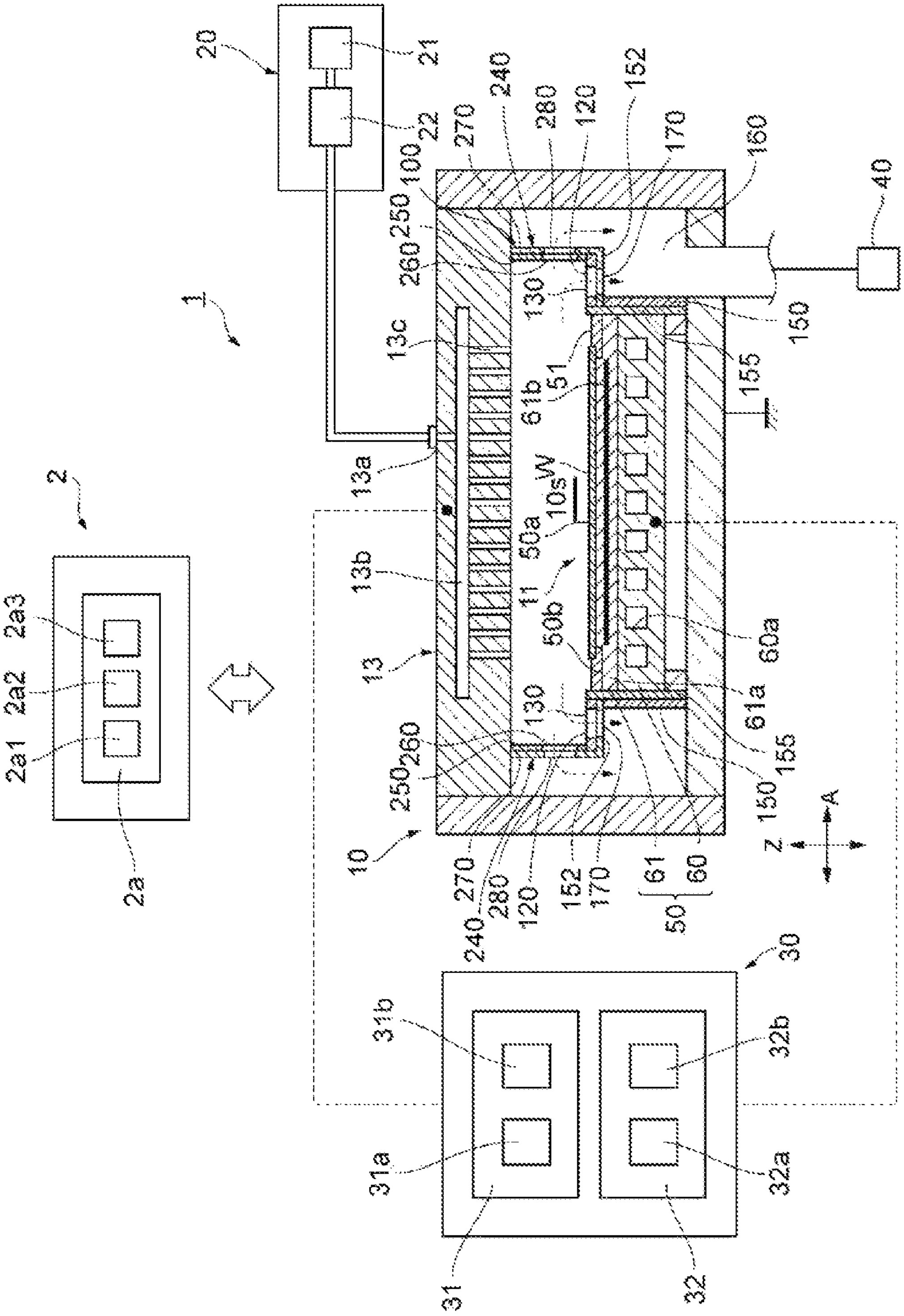
FIG. 5 shows an outline of a configuration example of a plasma processing apparatus according to an embodiment 2.

In one embodiment, the plasma processing apparatus 1 includes a liner structure 240 instead of the liner structure of the embodiment 1. The liner structure 240 is configured to exhaust a gas in the plasma processing space 10*s* from a lateral side. FIG. 5 shows a configuration example of the plasma processing apparatus 1 including the plasma confinement structure 100 having the baffle structure and the liner structure 240.

In one embodiment, the liner structure 240 is disposed in the chamber 10 to surround the plasma processing space 10*s* above the substrate support 11. The liner structure 240 includes an inner cylindrical liner 250 and an outer cylindrical liner 270. In one embodiment, the inner cylindrical liner 250 has a cylindrical shape. The inner cylindrical liner 250 is disposed concentrically with the substrate support 11 and the upper baffle plate 120. The inner cylindrical liner 250 is disposed on the outer end of upper baffle plate 120. The inner cylindrical liner 250 is disposed at a lateral side of the plasma processing space 10*s* in the horizontal direction and exposed to the plasma processing space 10*s*. In one embodiment, similarly to the upper baffle plate 120, the inner cylindrical liner 250 contains an insulating material and has an insulating property. In one embodiment, the inner cylindrical liner 250 contains a material such as quartz, Si or SiC. The inner cylindrical liner 250 may contain a conductive material and have conductivity. In the example of FIG. 5, the inner cylindrical liner 250 is a separate member from the upper baffle plate 120. In this case, the inner cylindrical liner 250 may be in contact with the upper baffle plate 120, or may be separated from the upper baffle plate 120. Further, the inner cylindrical liner 250 may be integrated with the upper baffle plate 120. Although the outer cylindrical liner 270 is integrated with the lower baffle plate 152 in the example of FIG. 5, the outer cylindrical liner 270 may be a separate member from the lower baffle plate 152. In this case, the outer cylindrical liner 270 may be in contact with the lower baffle plate 152, or may be separated from the outer cylindrical liner 270.

The inner cylindrical liner 250 has a plurality of third openings 260. In one embodiment, each of the third opening 260 is an elongate hole extending in the vertical direction Z and penetrates through the inner cylindrical liner 250 from the inner surface to the outer surface thereof in the radial direction A. The third openings 260 are arranged at regular intervals along the circumferential direction R of the outer circumference of the substrate support 11. The third openings 260 may be arranges at intervals of 1° to 5° in the circumferential direction.

In one embodiment, the outer cylindrical liner 270 has a cylindrical shape. The outer cylindrical liner 270 is disposed concentrically with the substrate support 11 and the lower baffle plate 152. The outer cylindrical liner 270 is disposed on the outer end of the lower baffle plate 152. The outer cylindrical liner 270 overlaps with the inner cylindrical liner 250 at the outer side thereof in the radial direction A. The outer cylindrical liner 270 contains a conductive material such as aluminum (Al), and has conductivity. The outer cylindrical liner 270 has a plasma-resistant coating on a part or an entire surface thereof.

The outer cylindrical liner 270 has a plurality of fourth openings 280. In one embodiment, each of the fourth openings 280 is an elongated hole extending in the vertical direction Z, and penetrates through the outer cylindrical liner 270 from the inner surface to the outer surface thereof in the radial direction A. The fourth openings 280 whose number is the same as those of the third openings 260 are arranged at regular intervals that are the same as those of the third openings 260 along the circumferential direction R of the outer circumference of the substrate support 11. The fourth openings 280 may be arranged at intervals of 1° to 5° in the circumferential direction. The fourth openings 280 communicate with the corresponding third openings 260, respectively. The outer space of the fourth openings 280 communicates with the exhaust passage 160.

Figure 6:
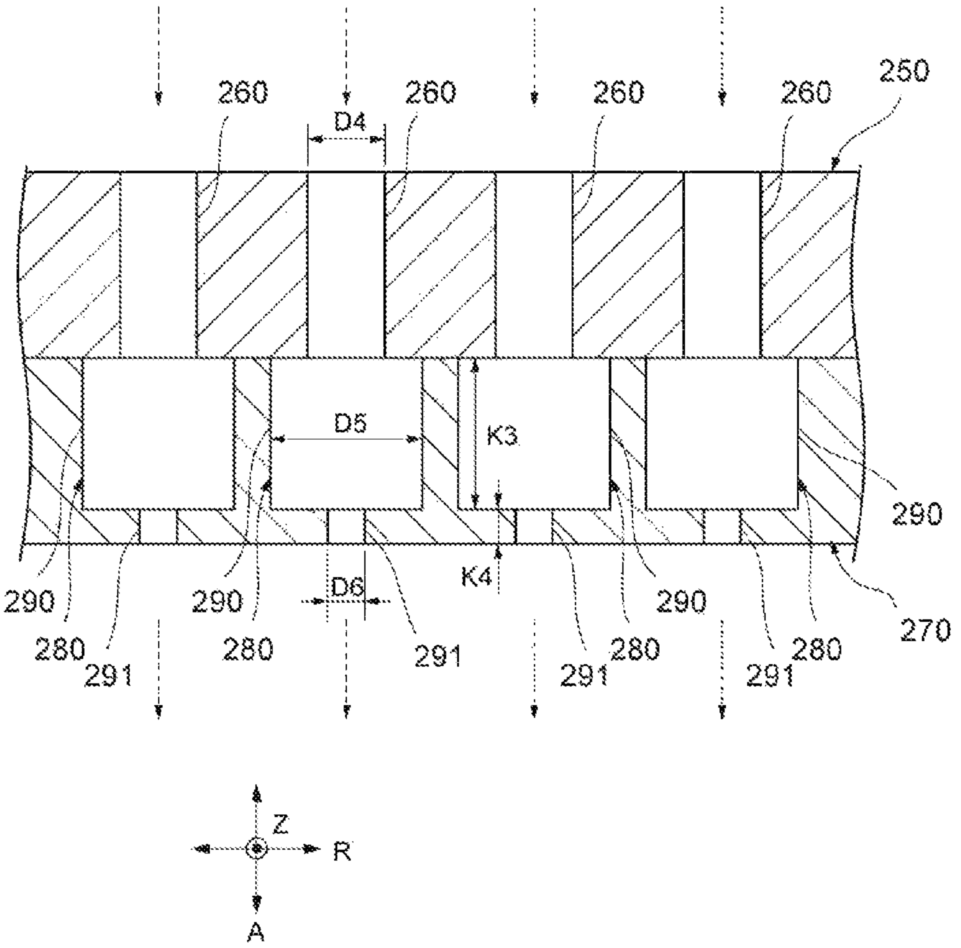
FIG. 6 is a horizontal cross-sectional view showing examples of widths of a third opening and a fourth opening in the case where an inner cylindrical liner and an outer cylindrical liner are taken along the circumferential direction.

FIG. 6 is a horizontal cross-sectional view showing examples of widths of the third opening 260 and the fourth opening 280 in the case where the inner cylindrical liner 250 and the outer cylindrical liner 270 are taken along the circumferential direction R in one embodiment. In one embodiment, the third opening 260 has a fourth width D4 that is constant from the inlet to the outlet of the third opening 260 in the circumferential direction (the short side direction of the third opening 260) R of the third opening 260.

In one embodiment, the fourth opening 280 has an inner opening portion 290 disposed at the upstream side of the fourth opening 280 and an outer opening portion 291 disposed at the downstream side of the fourth opening 280. The inner opening portion 290 has a fifth width D5 that is constant from the inlet to the outlet of the inner opening portion 290 in the circumferential direction (the short side direction of the fourth opening 280) R of the fourth opening 280. The fifth width D5 is greater than the fourth width D4.

The outer opening portion 291 has a sixth width D6 that is constant from the inlet to the outlet of the outer opening portion 291 in the circumferential direction R of the fourth opening 280. The sixth width D6 is smaller than the fourth width D4 and the fifth width D5.

The ratio of the fourth width D4 to the fifth width D5 is within a range of 1:10 to 9:10.

The ratio of the sixth width D6 to the fourth width D4 is within a range of 1:10 to 9:10.

A length K4 of the outer opening 291 is smaller than or equal to a length K3 of the inner opening 290. In one embodiment, the ratio of the length K3 of inner opening portion 290 to the length K4 of outer opening portion 291 is within a range of 1:1 to 10:1.

Figure 7:
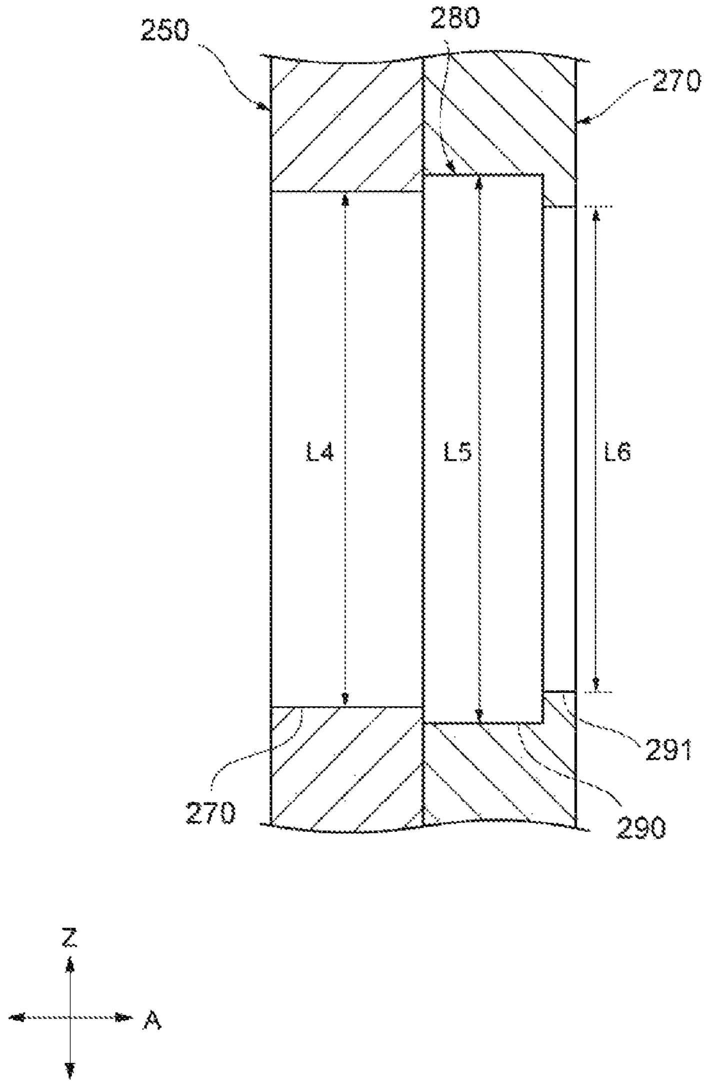
FIG. 7 is a horizontal cross-sectional view showing examples of lengths of the third opening and the fourth opening in the case where the inner cylindrical liner and the outer cylindrical liner are taken along a vertical direction.

FIG. 7 is a vertical cross-sectional view showing examples of lengths of the third opening 260 and the fourth opening 280 in the case where the inner cylindrical liner 250 and the outer cylindrical liner 270 are taken along the vertical direction Z in one embodiment. The third opening 260 has a fourth length L4 that is constant from the inlet to the outlet of the third opening 260 in the vertical direction Z of the third opening 260.

The inner opening portion 290 of the fourth opening 280 has a fifth length L5 that is constant from the inlet to the outlet of the fourth opening 280 in the vertical direction Z of the fourth opening 280. In one embodiment, the fifth length L5 is greater than fourth length L4. The outer opening portion 291 of the fourth opening 280 has a sixth length L6 that is constant from the inlet to the outlet of the fourth opening 280 in the vertical direction Z of the fourth opening 280. In one embodiment, the sixth length L6 is smaller than the fourth length L4 and the fifth length L5.

The first width D1 of the first opening 130 and the fourth width D4 of the third opening 260 may be the same or may be different. The second width D2 of the second opening 170, the fifth width D5 of the fourth opening 280, the third width D3 of the second opening 170, and the sixth width D6 of the fourth opening 280 may be the same or may be different. Other configurations may be the same as those of the embodiment 1.

During the etching process, the atmosphere in the plasma processing space 10*s* flows into the first openings 130, passes through the second openings 170, and is exhausted from the gas outlet 10*e* through the exhaust passage 160. Further, the atmosphere in the plasma processing space 10*s* flows into the third openings 260, passes through the fourth openings 280, and is exhausted from the gas outlet 10*e* through the exhaust passage 160.

In accordance with the present embodiment, the second opening 170 on the lower side of the plasma processing space 10*s* has the upper opening portion 200 with the second width D2 greater than the first width D1 and the lower opening portion 201 with the third width D3 smaller than the first width D1. Further, the fourth opening 280 on the lateral side of the plasma processing space 10*s* has the inner opening portion 290 with the fifth width D5 greater than the fourth width D4 and the outer opening portion 291 with the sixth width D6 smaller than the fourth width D4. Therefore, it is possible to control the exhaust of the atmosphere in the plasma processing space 10*s* while ensuring the exhaust of the atmosphere in the plasma processing space 10*s*. Accordingly, temporal changes in the exhaust function of the plasma processing apparatus 1 can be suppressed.

Embodiment 3 of Plasma Processing Apparatus 1

Figure 8:
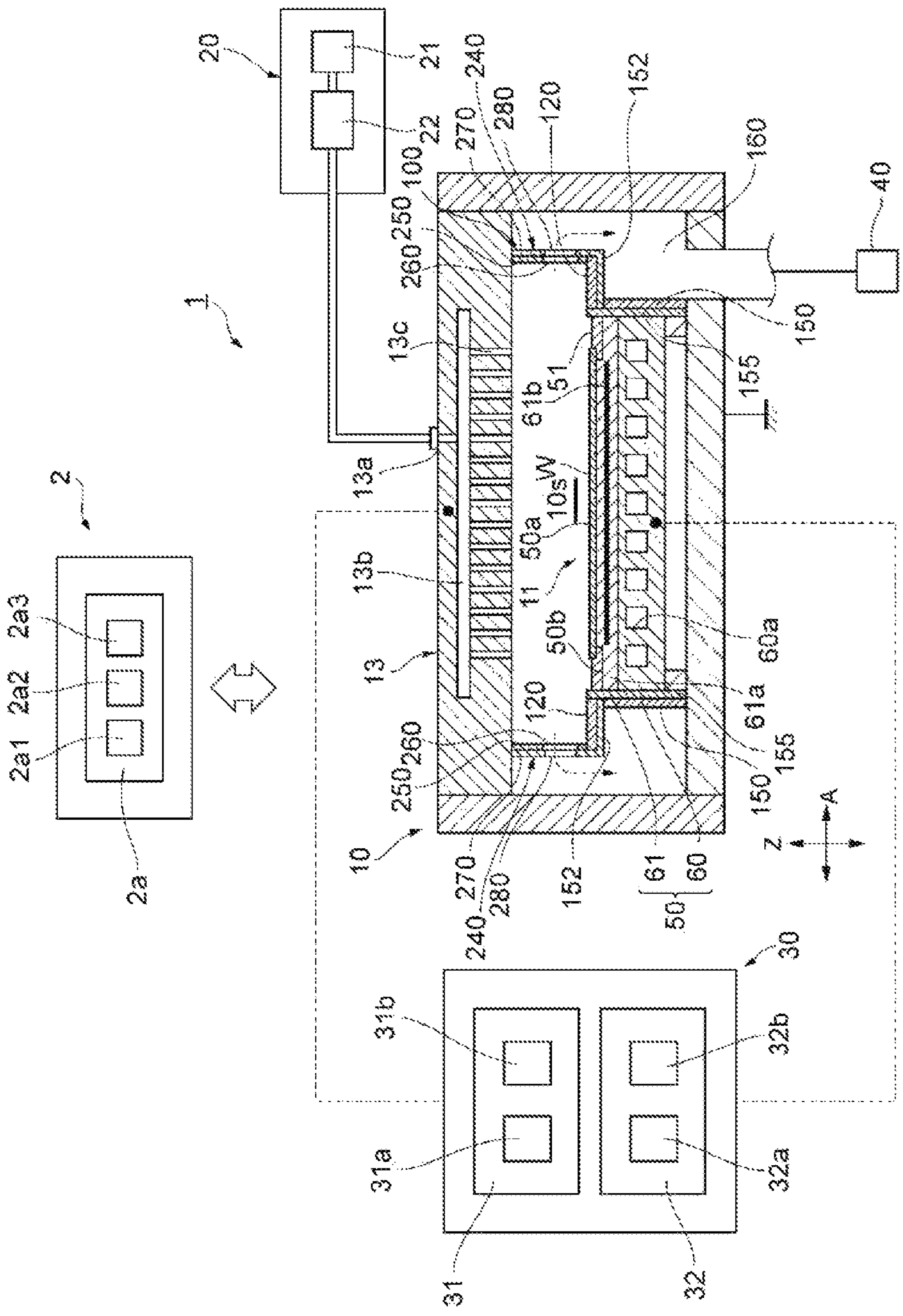
FIG. 8 shows an outline of a configuration example of a plasma processing apparatus according to an embodiment 3.

In one embodiment, the plasma processing apparatus 1 may include a baffle structure having no opening instead of the baffle structure of the embodiment 2. Thus, the plasma processing apparatus 1 includes the liner structure 240 having the third openings 260 and the fourth openings 280 and a non-porous baffle structure. Accordingly, the atmosphere in the plasma processing space 10*s* is exhausted only from the lateral side. FIG. 8 shows a configuration example of the plasma processing apparatus 1 of the present embodiment. In the present embodiment, the inner cylindrical liner 250 has the third openings 260 and the outer cylindrical liner 270 has the fourth openings 280. On the other hand, the upper baffle plate 120 is not provided with the first openings 130, and the lower baffle plate 152 is not provided with the second openings 170. Other configurations are the same as those of the embodiment 2.

Embodiment 4 of Plasma Processing Apparatus 1

Figure 9:
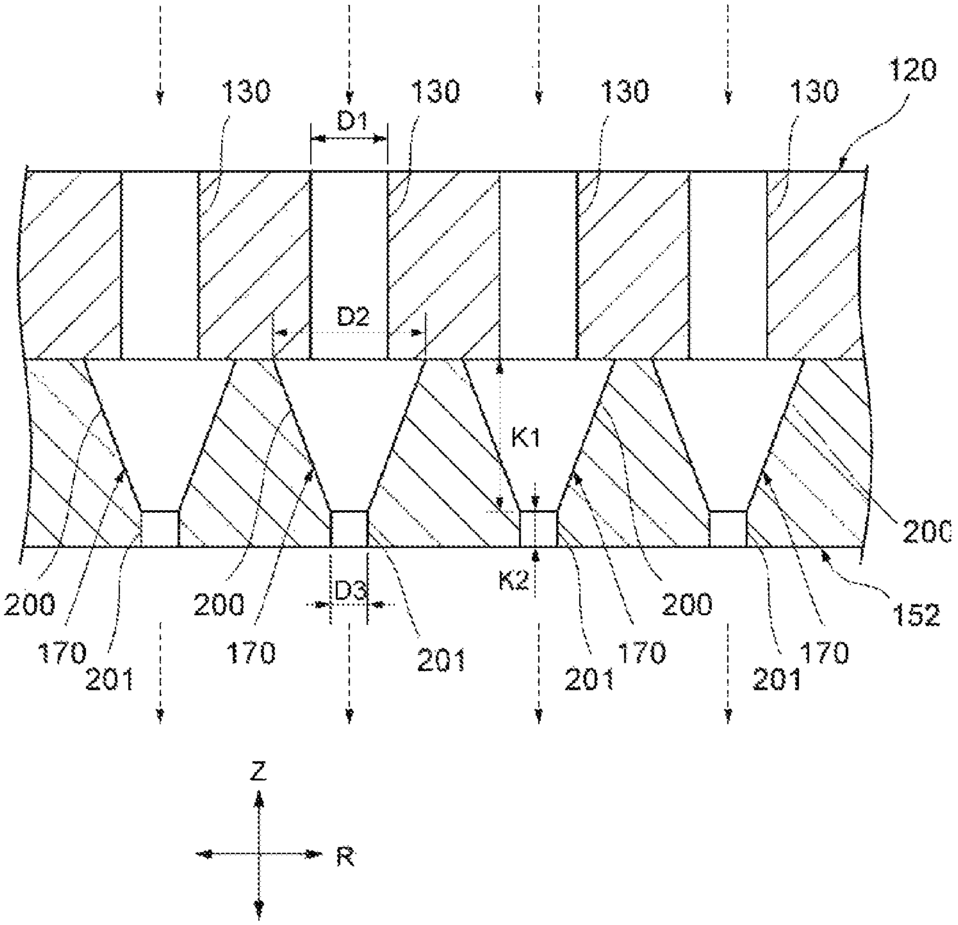
FIG. 9 is a vertical cross-sectional view showing examples of widths of a first opening and a second opening in the case where an upper baffle plate and a lower baffle plate are taken along the circumferential direction in an embodiment 4.

FIG. 9 shows another configuration example of the second openings 170 in the lower baffle plate 152. In one embodiment, in the circumferential direction R of the second opening 170, the upper opening portion 200 of the second opening 170 may have the second width D2 at the inlet of the upper opening portion 200, and may have the third width D3 at the outlet of the upper opening portion 200. Accordingly, the second opening 170 may have a shape in which a width is reduced from the inlet to the outlet of the upper opening portion 200. The second width D2 is greater than the first width D1, and the third width D3 is smaller than the first width D1. In this case as well, the exhaust of the atmosphere in the plasma processing space 10*s* can be controlled at the second openings 170.

Figure 10:
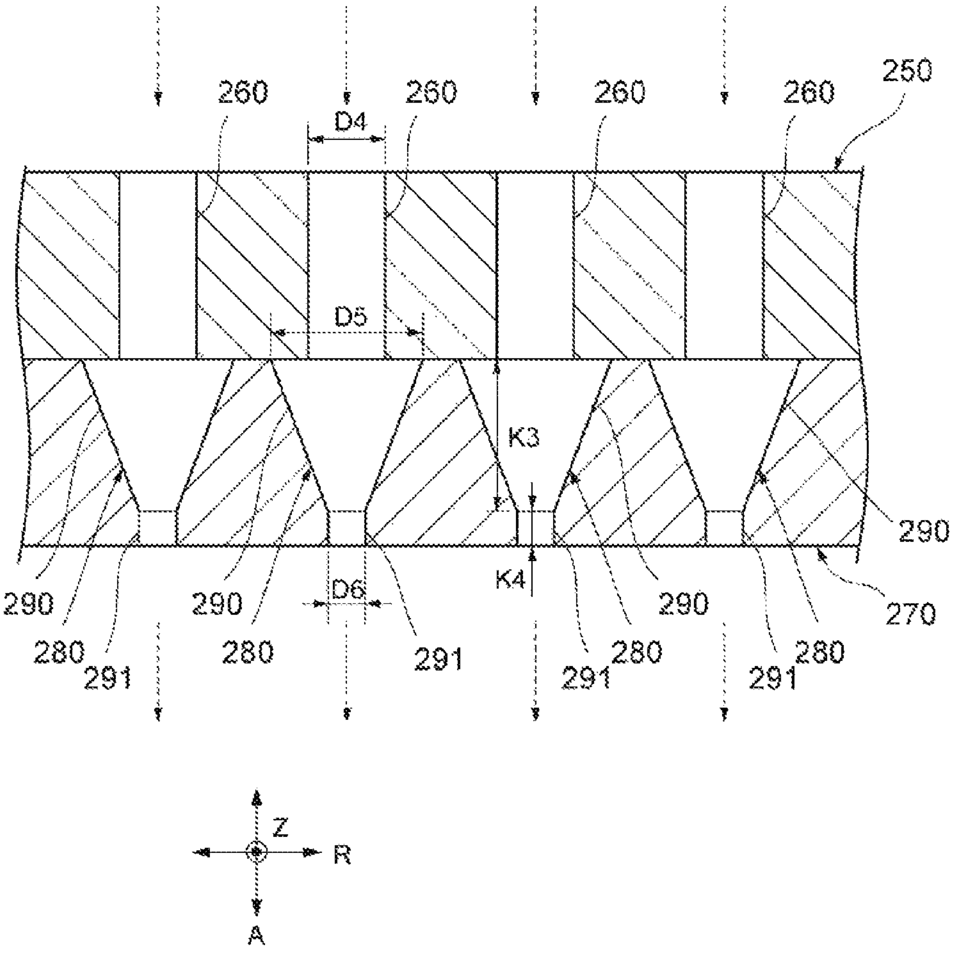
FIG. 10 is a horizontal cross-sectional view showing examples of widths of a third opening and a fourth opening in the case where an inner cylindrical liner and an outer cylindrical liner are taken along the circumferential direction in the embodiment 4.

FIG. 10 shows another configuration example of the fourth openings 280 in the outer cylindrical liner 270. In one embodiment, in the circumferential direction R of the fourth opening 280, the inner opening portion 290 of the fourth opening 280 may have the fifth width D5 at the inlet of the inner opening portion 290 and the sixth width D6 at the outlet of the inner opening portion 290. Accordingly, the fourth opening 280 may have a shape in which a width is reduced from the inlet to the outlet of the inner opening portion 290. The fifth width D5 is greater than the fourth width D4, and the sixth width D6 is smaller than the fourth width D4. In this case as well, the exhaust of the atmosphere in the plasma processing space 10*s* can be controlled at the fourth openings 280.

The plasma processing apparatus of the present disclosure may be variously modified without departing from the scope and spirit of the present disclosure. For example, some components in one embodiment may be added to another embodiment within the scope of ordinary creativity of those skilled in the art. Further, some components in one embodiment may be replaced with corresponding components in another embodiment.

The present plasma processing apparatus may be a plasma processing apparatus using any plasma source, such as inductively coupled plasma, microwave plasma, or the like, other than a capacitively coupled plasma processing apparatus.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

The invention claimed is:

1. A plasma processing apparatus comprising:

a plasma processing chamber;

a substrate support disposed in the plasma processing chamber;

a baffle structure disposed in the plasma processing chamber to surround the substrate support, the baffle structure including an upper baffle plate and a lower baffle plate, the upper baffle plate having a plurality of first openings, each of the plurality of first openings having a first width, the lower baffle plate having conductivity and coupled to a ground potential, the lower baffle plate having a plurality of second openings, each of the plurality of second openings having an upper opening portion and a lower opening portion, the upper opening portion having a second width greater than the first width, the lower opening portion having a third width smaller than the first width; and a liner structure disposed in the plasma processing chamber to surround a plasma processing space disposed above the substrate support, the liner structure including an inner cylindrical liner and an outer cylindrical liner, the inner cylindrical liner having a plurality of third openings, each of the plurality of third openings having a fourth width, the outer cylindrical liner having conductivity and coupled to a ground potential, the outer cylindrical liner having a plurality of fourth openings, each of the plurality of fourth openings having an inner opening portion and an outer opening portion, the inner opening portion having a fifth width greater than the fourth width, the outer opening portion having a sixth width smaller than the fourth width.

2. The plasma processing apparatus of claim 1, wherein each of the plurality of first openings has the first width from an inlet to an outlet of each of the plurality of first openings.

3. The plasma processing apparatus of claim 2, wherein each of the plurality of third openings has the fourth width from an inlet to an outlet of each of the plurality of third openings.

4. The plasma processing apparatus of claim 3, wherein the upper opening portion of each of the plurality of second openings has the second width from an inlet to an outlet of the upper opening portion.

5. The plasma processing apparatus of claim 3, wherein the upper opening portion of each of the plurality of second openings has the second width at an inlet of the upper opening portion and the third width at an outlet of the upper opening portion, and has a shape with a width that is reduced from the inlet to the outlet of the upper opening portion.

6. The plasma processing apparatus of claim 1, wherein the inner opening portion of each of the plurality of fourth openings has the fifth width from an inlet to an outlet of the inner opening portion.

7. The plasma processing apparatus of claim 1, wherein the inner opening portion of each of the plurality of fourth openings has the fifth width at an inlet of the inner opening portion and the sixth width at an outlet of the inner opening portion, and has a shape with a width that is reduced from the inlet to the outlet of the inner opening portion.

8. The plasma processing apparatus of claim 1, wherein the inner cylindrical liner and the upper baffle plate contain a conductive material or an insulating material.

9. The plasma processing apparatus of claim 1, wherein the inner cylindrical liner and the upper baffle plate contain a material formed from quartz, Si or SIC.

10. The plasma processing apparatus of claim 9, wherein the outer cylindrical liner and the lower baffle plate contain a conductive material.

11. The plasma processing apparatus of claim 9, wherein the outer cylindrical liner and the lower baffle plate include a conductive material and a plasma resistant coating on the conductive material.

12. The plasma processing apparatus of claim 11, wherein the conductive material of the outer cylindrical liner and the lower baffle plate is formed from aluminum.

13. The plasma processing apparatus of claim 1, wherein a ratio of the first width to the second width is within a range of 1:10 to 9:10, and a ratio of the third width to the first width is within a range of 1:10 to 9:10.

14. The plasma processing apparatus of claim 1, wherein a ratio of the fourth width to the fifth width is within a range of 1:10 to 9:10, and a ratio of the sixth width to the fourth width is within a range of 1:10 to 9:10.

15. A plasma processing apparatus comprising:

a plasma processing chamber;

a substrate support disposed in the plasma processing chamber;

a liner structure disposed in the plasma processing chamber to surround a plasma processing space disposed above the substrate support, the liner structure including an inner liner and an outer liner, the inner liner having a plurality of first openings, each of the plurality of first openings having a first width, the outer liner having conductivity and coupled to a ground potential, the outer liner having a plurality of second openings, each of the plurality of second openings having an inner opening portion and an outer opening portion, the inner opening portion having a second width greater than the first width, the outer opening portion having a third width smaller than the first width.

16. A plasma processing apparatus comprising:

a plasma processing chamber;

a substrate support disposed in the plasma processing chamber; and a baffle structure disposed in the plasma processing chamber to surround the substrate support, the baffle structure including an upper baffle and a lower baffle, the upper baffle having a plurality of first openings, each of the plurality of first openings having a first width, the lower baffle having conductivity and coupled to a ground potential, the lower baffle having a plurality of second openings, each of the plurality of second openings having an upper opening portion and a lower opening portion, the upper opening portion having a second width greater than the first width, the lower opening portion having a third width smaller than the first width.

* * * * *